United States Patent
Chen et al.

(10) Patent No.: US 11,515,219 B2
(45) Date of Patent: Nov. 29, 2022

(54) METHOD FOR FINDING SUSPICIOUS MANUFACTURING MACHINES AND PROCESSING FACTORS AT PROCESSING WORKSTATIONS OF CAUSING DEFECTS, ELECTRONIC DEVICE USING METHOD, AND NON-TRANSITORY STORAGE MEDIUM

(71) Applicant: Fulian Precision Electronics (Tianjin) Co., LTD., Tianjin (CN)

(72) Inventors: Yi-Ru Chen, New Taipei (TW); Hsueh-Fang Ai, New Taipei (TW); Shang-Yi Lin, New Taipei (TW); Kai-Hsun Hsueh, New Taipei (TW)

(73) Assignee: Fulian Precision Electronics (Tianjin) Co., LTD., Tianjin (CN)

( * ) Notice: Subject to any disclaimer, the term of this patent is extended or adjusted under 35 U.S.C. 154(b) by 73 days.

(21) Appl. No.: 16/985,563

(22) Filed: Aug. 5, 2020

(65) Prior Publication Data
US 2021/0397168 A1 Dec. 23, 2021

(30) Foreign Application Priority Data
Jun. 17, 2020 (CN) .......................... 202010555966.7

(51) Int. Cl.
*H01L 21/66* (2006.01)
*G05B 19/418* (2006.01)

(52) U.S. Cl.
CPC .......... *H01L 22/20* (2013.01); *G05B 19/4183* (2013.01); *G05B 19/4184* (2013.01); *G05B 19/41875* (2013.01)

(58) Field of Classification Search
CPC .......................... G05B 19/4183; H01L 22/20
See application file for complete search history.

(56) References Cited

U.S. PATENT DOCUMENTS

| | | | |
|---|---|---|---|
| 2005/0233400 A1* | 10/2005 | Weiner | G01N 33/721 435/7.92 |
| 2018/0059639 A1* | 3/2018 | Saitou | G05B 19/406 |
| 2020/0333765 A1* | 10/2020 | Biernat | G06F 16/27 |
| 2021/0232126 A1* | 7/2021 | Feyo Gebhard | G05B 19/4183 |

* cited by examiner

*Primary Examiner* — Eman A Alkafawi
(74) *Attorney, Agent, or Firm* — ScienBiziP, P.C.

(57) ABSTRACT

A method for finding manufactured or to-be-manufactured products for defects includes obtaining basic information on processing history of products passed by each manufacturing machine at each processing workstation, and obtaining processing factor information of same, where each product is passed by a defect detection workstation after the product is passed by at least one processing workstation. The method includes obtaining quality information detected by each defect detection workstation. The method determines one or more problem manufacturing machines at one or more problem processing workstations according to the basic information on processing history and the quality information of the products. The method further determines one or more processing factors which influence the problem manufacturing machines according to the processing factor information of each manufacturing machine and the quality information of the products. A related electronic device and non-transitory storage medium are also provided.

14 Claims, 3 Drawing Sheets

METHOD FOR FINDING SUSPICIOUS MANUFACTURING MACHINES AND PROCESSING FACTORS AT PROCESSING WORKSTATIONS OF CAUSING DEFECTS, ELECTRONIC DEVICE USING METHOD, AND NON-TRANSITORY STORAGE MEDIUM

FIELD

The subject matter herein generally relates to quality control and particularly, to a method for finding suspicious manufacturing machines and processing factors at processing workstations of causing defects, an electronic device using the method, and a non-transitory storage medium.

BACKGROUND

In semiconductor manufacturing, products (including raw materials as well as semi-finished products), may pass through a number of processing workstations in a manufacturing process. In each processing workstation, there may be a number of manufacturing machines, each carrying out a certain process. Due to differences in kinds of products and difference of parameters, the products may be passed by a same processing workstation and/or a same manufacturing machine or a different processing workstation and/or a different manufacturing machine, and detecting of defects takes place at the workstations of a number of phases to detect information as to defects in the products. To provide production yield rate, information of the products may be stated in terms of manually determining processing workstations that are problematic, and manufacturing machines that are problematic. However, the efficiency of manual analysis is low, and the accuracy of the analysis depends on the skill of the analyst. Knowing the processing factors which influence the workstations and manufacturing machines is very necessary.

BRIEF DESCRIPTION OF THE DRAWINGS

Many aspects of the disclosure can be better understood with reference to the following drawings. The components in the drawings are not necessarily drawn to scale, the emphasis instead being placed upon clearly illustrating the principles of the disclosure. Moreover, in the drawings, like reference numerals designate corresponding parts throughout the several views.

DETAILED DESCRIPTION

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

The present disclosure, referencing the accompanying drawings, is illustrated by way of examples and not by way of limitation. It should be noted that references to "an" or "one" embodiment in this disclosure are not necessarily to the same embodiment, and such references mean "at least one."

Figure 1:
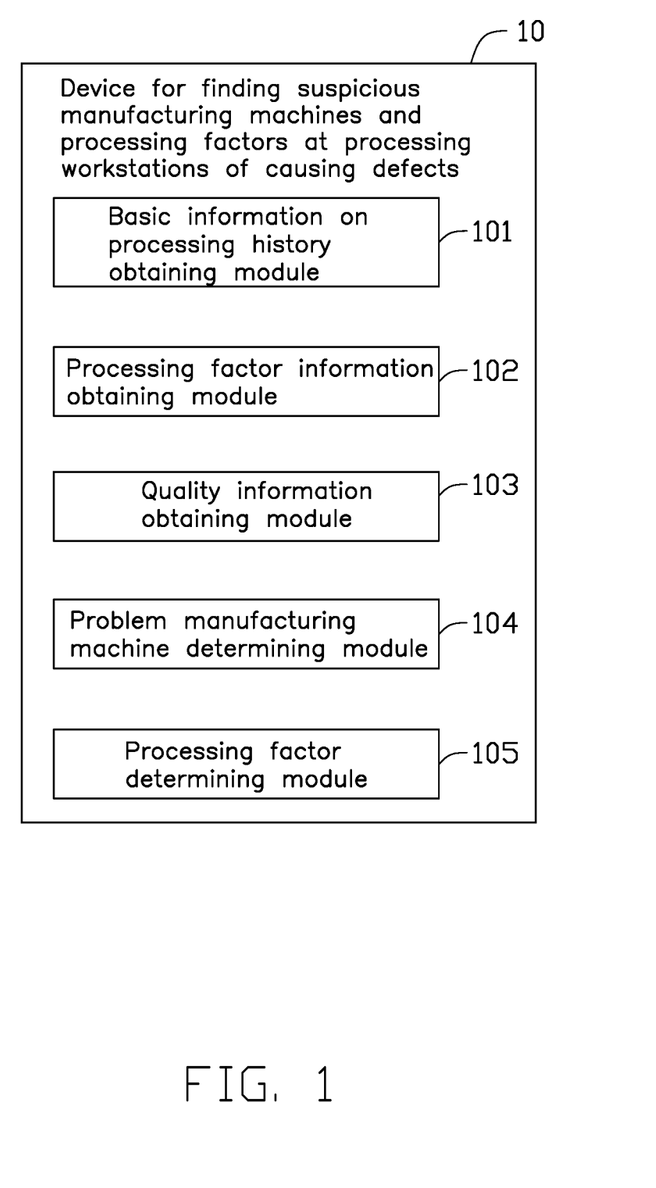
FIG. 1 illustrates a block diagram of a first embodiment of a device for finding suspicious manufacturing machines and processing factors at processing workstations of causing defects.

FIG. 1 illustrates a device for finding suspicious manufacturing machines and processing factors at processing workstations of causing defects (hereinafter device 10). The device 10 can be applied in an electronic device. The electronic device can be any suitable electronic device, for example, a smart phone, a laptop, a tablet computer, or the like. The device 10 includes a basic information on processing history obtaining module 101, a processing factor information obtaining module 102, a quality information obtaining module 103, a problem manufacturing machine determining module 104, and a processing factor determining module 105. The basic information on processing history obtaining module 101 is configured to obtain basic information on processing history of the products passed by each manufacturing machine at each processing workstation. The processing factor information obtaining module 102 is configured to obtain processing factor information of each manufacturing machine at each processing workstation, where each product is passed by a defect detection workstation after the product is passed by at least one processing workstation. The quality information obtaining module 103 is configured to obtain information as to defects (quality information) detected by each defect detection workstation. The problem manufacturing machine determining module 104 is configured to determine one or more problem manufacturing machines at one or more problem processing workstations according to the basic information on processing history of the products passed by each manufacturing machine at each processing workstation and the quality information of the products. The processing factor determining module 105 is configured to determine one or more processing factors influencing the problem manufacturing machines according to the processing factor information of each manufacturing machine and the quality information of the products. A method for finding suspicious manufacturing machines and processing factors at processing workstations of causing defects (hereinafter method) will be described.

Figure 2:
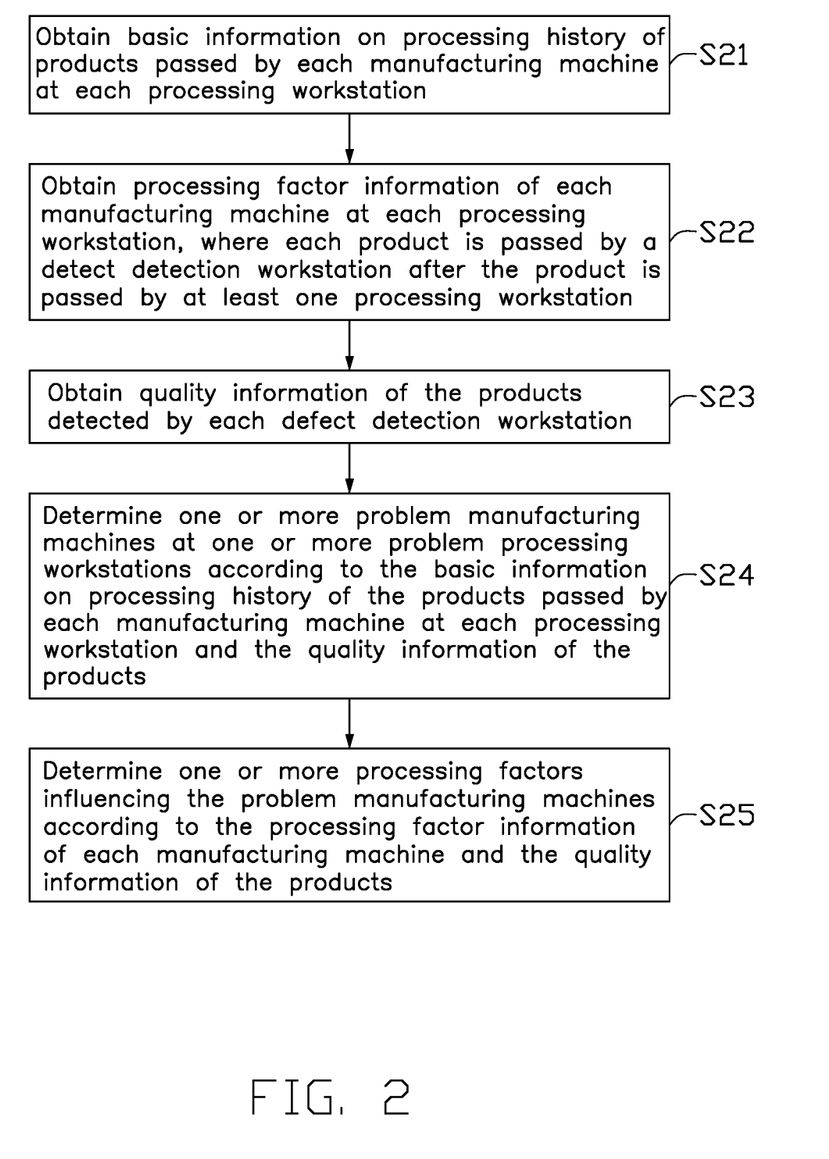
FIG. 2 illustrates a flowchart of a second embodiment of a method for finding suspicious manufacturing machines and processing factors at processing workstations of causing defects.

FIG. 2 illustrates a flowchart of an embodiment of the method. The method begins at block S21.

At block S21, obtaining basic information on processing history of the products passed by each manufacturing machine at each processing workstation.

Each processing workstation may be arranged on/in/after one or more manufacturing machines. Each product may be a raw material or a semi-finished product, or partly both. Due to a difference in the products, the products may be passed by different manufacturing machines and different processing workstations. The basic information on processing history of the products may include product codes, processing workstations, manufacturing machine codes, and finish times of the processing. Each product code is constant and unchanging as the product is passed by different manufacturing machines and different processing workstations. In the embodiment, obtaining basic information on processing history of the products passed by each manufacturing machine at each processing workstation can be done from a database. Before obtaining basic information on processing history of the products passed by each manufacturing machine at each processing workstation from a database, the method further includes a step c1 and a step d1. The step c1 includes collecting the basic information on processing history of the products passed by each manufacturing machine at each processing workstation in a first preset period. The step d1 includes storing the collected basic information on processing history of the products passed by each manufacturing machine at each processing workstation to the database. The first preset period can be fixed or variable.

At block S22, obtaining processing factor information of each manufacturing machine at each processing workstation, where each product is passed by a defect detection workstation after the product is passed by at least one processing workstation.

The processing factor information of each manufacturing machine includes a product code and a processing factor of the manufacturing machine. The processing factor of the manufacturing machine can be a preset information of the manufacturing machine when one product is passed by the manufacturing machine. For example, when a product A is passed by the manufacturing machine, a preset temperature of the manufacturing machine is 100 degrees Celsius, an elevation or level of the manufacturing machine at 0.58 meters, and so on. Or for example, when a product B is passed by the manufacturing machine, although a preset temperature of the manufacturing machine should be 100 degrees Celsius, an actual temperature of the manufacturing machine is 99.5 degrees Celsius. The preset elevation or level of the manufacturing machine should be at 0.58 meters, and an actual elevation or level of the manufacturing machine is at 0.58 meters, and so on. In the embodiment, obtaining processing factor information of each manufacturing machine at each processing workstation from the database. Before obtaining processing factor information of each manufacturing machine at each processing workstation from the database, the method further includes a step c2 and a step d2. The step c2 includes collecting the processing factor information of each manufacturing machine at each processing workstation in a second preset period. The step d2 includes storing the collected processing factor information of each manufacturing machine at each processing workstation to the database. The second preset period can be fixed or variable. The storing of the collected processing factor information of each manufacturing machine at each processing workstation to the database includes step c3 and step d3. The step c3 includes extracting the processing factor information of the manufacturing machine and storing the extracted processing factor information of the manufacturing machine to the database if a speed of generating the processing factor information of the manufacturing machine is greater than a preset speed value when the products are passed by the manufacturing machine. The step d3 includes storing the collected processing factor information of the manufacturing machine to the processing workstation to the database if a speed of generating the processing factor information of the manufacturing machine is slower than or equal to a preset speed value when the products are passed by the manufacturing machine. The extracting of the processing factor information of the manufacturing machine includes: extracting characteristics of the processing factor information of the manufacturing machine as a value. The characteristics value includes an average value, a greatest value, a least value, and so on.

At block S23, obtaining quality information of the products detected by each defect detection workstation.

The quality information of the products includes defect codes of the products, defect items, and defect results. Each defect code of the product corresponds to one product code. The defects of different products can be the same or different. The defect results include data of "1" and data of "0". Data of "1" represents that the product does have the defect item. Data of "0" represents that the product does not have any defect item.

In the embodiment, obtaining quality information of the products detected by each defect detection workstation from the database. Before obtaining quality information of the products detected by each defect detection workstation from the database, the method further includes a step c3 and a step d3. The step c3 includes collecting the quality information of the products detected by each defect detection workstation in a third preset period. The step d3 includes storing the collected quality information of the products detected by each defect detection workstation to the database. The third preset period can be fixed or variable.

At block S24, determining one or more problem manufacturing machines at one or more problem processing workstations according to the basic information on processing history of the products passed by each manufacturing machine at each processing workstation and the quality information of the products.

In the embodiment, before determining the ID or other designation of one or more problem manufacturing machines at one or more problem processing workstations according to the basic information on processing history of the products passed by each manufacturing machine at each processing workstation and the quality information of the products, the method further includes: concatenating the basic information on processing history of the products passed by each manufacturing machine at each processing workstation and the quality information of the products according to the product codes and the defect codes of the products.

In the embodiment, the determining of one or more problem manufacturing machines at one or more problem processing workstations according to the basic information on processing history of the products passed by each manufacturing machine at each processing workstation and the quality information of the products includes: determining one or more problem manufacturing machines at one or more problem processing workstations according to the concatenated basic information on processing history of the products passed by each manufacturing machine at each processing workstation and the quality information of the products.

In the embodiment, determining one or more problem manufacturing machines at one or more problem processing workstations according to the basic information on processing history of the products passed by each manufacturing machine at each processing workstation and the quality information of the products includes a step c4 and a step d4. The step c4 includes determining a concentration degree of the defect of the preset combination according to the basic information on processing history of the products passed by each manufacturing machine at each processing workstation and the quality information of the products, where the preset combination is a combination of the manufacturing machine and the processing workstation. The step d4 includes determining one or more problem manufacturing machines at one or more problem processing workstations according to the concentration degree of the defect of the preset combination.

In the embodiment, determining a concentration degree of the defect of the preset combination according to the basic information on processing history of the products passed by each manufacturing machine at each processing workstation and the quality information of the products includes a step c5, a step d5, a step e5, and a step f5. The step c5 includes determining a ratio a1 of an output of the products passed by each preset combination to a total output of the products passed by all the preset combinations according to the basic information on processing history of the products passed by each manufacturing machine at each processing workstation. The step d5 includes determining a ratio a2 of an output of defect products passed by each preset combination to the output of the products passed by each preset combination according to the basic information on processing history of the products passed by each manufacturing machine at each processing workstation and the quality information of the products. The step e5 includes determining a ratio a4 of the ratio a2 to a ratio a3 which is equal to a ratio of a total output of defect products passed by all the preset combinations to the total output of the products passed by all the preset combinations. The step f5 includes determining the concentration degree of the defect of the preset combination according to the ratio a1, the ratio a2, and the ratio a4.

In the embodiment, determining the concentration degree of the defect of the preset combination according to the ratio a1, the ratio a2, and the ratio a4 includes a step c6 and a step d6. The step c6 includes calculating a number of values of preset function with the ratio a1, the ratio a2, and the ratio a4 as the parameters. For example, calculating a number of products of the ratio a1, the ratio a2, and the ratio a4. The step d6 includes determining the concentration degree of the defect of the preset combination according to the values of the preset function. Where, according to a difference of the preset functions, criteria of the concentration degree of the defect of the preset combination are different. For example, the concentration degree of the defect of the preset combination is higher if the value of the preset function is greater, and the concentration degree of the defect of the preset combination is lower if the value of the preset function is less. Or for example, the concentration degree of the defect of the preset combination is higher if the value of the preset function is less, and the concentration degree of the defect of the preset combination is lower if the value of the preset function is greater.

In the embodiment, determining the concentration degree of the defect of the preset combination according to the values of the preset function includes a step c7 and a step d7. The step c7 includes sorting the values of the preset function according to a first preset order, where the first preset order can be from big to small or from small to big. The step d7 includes determining the concentration degree of the defect of the preset combination according to the sorted values of the preset function.

At block S25, determining one or more processing factors influencing the problem manufacturing machines according to the processing factor information of each manufacturing machine and the quality information of the products.

In the embodiment, before determining one or more processing factors of influencing the problem manufacturing machines according to the processing factor information of each manufacturing machine and the quality information of the products, the method further includes: concatenating the processing factor information of each manufacturing machine and the quality information of the products according to the product codes.

In the embodiment, the determining of one or more processing factors influencing the problem manufacturing machines according to the processing factor information of each manufacturing machine and the quality information of the products includes: determining one or more processing factors influencing the problem manufacturing machines according to the concatenated processing factor information of each manufacturing machine and the quality information of the products.

In the embodiment, the determining of one or more processing factors influencing the problem manufacturing machines according to the processing factor information of each manufacturing machine and the quality information of the products includes a step c8, a step d8, and a step e8. The step c8 includes determining a type of each processing factor of each manufacturing machine to be either a continuous type or a categorical type according to the processing factor information of each manufacturing machine. The step d8 includes determining each test method from a Student's t test, a Mann-Whitney-Wilcoxon test, a Chi-square test, and a Fisher's exact test according to the type of processing factor of each manufacturing machine and a number of quality information of the products passed by the problem manufacturing machines. The step e8 includes determining one or more processing factors influencing the problem manufacturing machines according to the processing factor information of each manufacturing machine and the quality information of the products via the determined test method.

In the embodiment, determining a type of processing factor of each manufacturing machine to be either a continuous type or a categorical type according to the processing factor information of each manufacturing machine includes a step c9, a step d9, and a step e9. The step c9 includes determining whether the number of different kinds of value of the processing factor of the manufacturing machine in the processing factor information of each manufacturing machine is greater than five. For example, determining whether the number of different kinds of value of required elevations of the manufacturing machine A is greater than five. The step d9 includes determining that the type of processing factor of the manufacturing machine is the continuous type if the number of different kinds of value of the processing factor of the manufacturing machine in the processing factor information of each manufacturing machine is greater than five. The step e9 includes determining that the type of the processing factor of the manufacturing machine is the categorical type if the number of different kinds of value of the processing factor of the manufacturing machine in the processing factor information of each manufacturing machine is not more than five.

In the embodiment, determining each test method from a Student's t test, a Mann-Whitney-Wilcoxon test, a Chi-square test, and a Fisher's exact test according to the type of each processing factor of each manufacturing machines and a number of quality information of the products passed by the problem manufacturing machines includes a step c10, a step d10, a step e10, and a step f10. The step c10 includes determining that the test method is the Student's t test if the type of the processing factor of the manufacturing machine is the continuous type and a number of the products passed by the problem manufacturing machine is thirty or more.

The step d10 includes determining that the test method is the Mann-Whitney-Wilcoxon test if the type of the processing factor of the manufacturing machine is the continuous type and a number of the products passed by the problem manufacturing machine is less than thirty.

The step e10 includes determining that the test method is the Chi-square test if the type of the processing factor of the manufacturing machine is the categorical type and a number of information representing that the product has no defect and a number of the information representing that the product has a defect in the quality information of the product passed by the problem manufacturing machine in each category each is five or more, or if the type of the processing factor of the manufacturing machine is the categorical type and a number of the categories is greater than two.

The step f10 includes determining that the test method is the Fisher's exact test if the type of the processing factor of the manufacturing machine is the categorical type, the number of the categories is two, and a number of the information representing that the product has no defect or a number of the information representing that the product has defect in the quality information of the product passed by the problem manufacturing machine in one of the two categories is less than five.

In the embodiment, determining one or more processing factors influencing the problem manufacturing machines according to the processing factor information of each manufacturing machine and the quality information of the products and via the determined test method includes a step c11 and a step d11. The step c11 includes determining a number of probabilities according to the processing factor information of each manufacturing machine and the quality information of the products and via the determined test method. The step d11 includes determining one or more processing factors influencing the problem manufacturing machines according to the probabilities. Where a possibility that the processing factor of the manufacturing machine is the processing factor influencing the problem manufacturing machine is less if the probability is greater, and a possibility that the processing factor of the manufacturing machine is the processing factor influencing the problem manufacturing machine is greater if the probability is less.

In the embodiment, determining one or more processing factors influencing the problem manufacturing machines according to the probabilities includes a step c12 and a step d12. The step c12 includes sorting the probabilities according to a second preset order, where the second preset order is from big to small or from small to big. The step d12 includes determining one or more processing factors influencing the problem manufacturing machines according to the sorted probabilities.

In other embodiment, after determining one or more problem manufacturing machines at one or more problem processing workstations according to the basic information on processing history of the products passed by each manufacturing machine at each processing workstation and the quality information of the products, the method further includes determining one or more problem is of one or more problem manufacturing machines at one or more problem processing workstations.

After determining one or more processing factors influencing the problem manufacturing machines according to the processing factor information of each manufacturing machine and the quality information of the products, the method further includes determining one or more processing factors influencing the problem chambers of the problem manufacturing machines.

The preset combination is a combination of the chamber, the manufacturing machine, and the processing workstation. Determining one or more problem chambers of one or more problem manufacturing machines at one or more problem processing workstations includes a step c13, a step d13, a step e13, and a step f13. The step c13 includes determining a ratio b1 of an output of the products passed by each preset combination to a total output of the products passed by all the preset combinations according to a basic information on processing history of the products passed by each chamber of each manufacturing machine at each processing workstation. The step d13 includes determining a ratio b2 of an output of defective products passed by each preset combination to the output of the products passed by each preset combination according to a basic information on processing history of the products passed by each chamber of each manufacturing machine at each processing workstation and the quality information of the products. The step e13 includes determining a ratio b4 of the ratio b2 to a ratio b3 which is equal to a ratio of a total output of defective products passed by all the preset combinations to the total output of the products passed by all the preset combinations. The step f13 includes determining the concentration degree of the defect of the preset combination according to the ratio b1, the ratio b2, and the ratio b4.

In the embodiment, determining the concentration degree of the defect of the preset combination according to the ratio b1, the ratio b2, and the ratio b4 includes a step c14 and a step d14. The step c14 includes calculating a number of values of preset function with the ratio b1, the ratio b2, and the ratio b4 as the parameters. For example, calculating a number of products of the ratio b1, the ratio b2, and the ratio b4. The step d14 includes determining the concentration degree of the defect of the preset combination according to the values of the preset function. Where, according to a difference of the preset functions, criteria of the concentration degree of the defect of the preset combinations are different. For example, the concentration degree of the defect of the preset combination is higher if the value of the preset function is greater, and the concentration degree of the defect of the preset combination is lower if the value of the preset function is less. Or for example, the concentration degree of the defect of the preset combination is higher if the value of the preset function is less, and the concentration degree of the defect of the preset combination is lower if the value of the preset function is greater.

In the embodiment, determining one or more processing factors influencing the problem chambers of the problem manufacturing machines includes a step c15, a step d15, and a step e15. The step c15 includes determining a type of each processing factor of each chamber of each manufacturing machine to be one of a continuous type and a categorical type according to the processing factor information of each chamber of each manufacturing machine. The step d15 includes determining each test method from a Student's t test, a Mann-Whitney-Wilcoxon test, a Chi-square test, and a Fisher's exact test according to the type of each processing factor of each chamber of each manufacturing machine and a number of quality information of the products passed by the problem chambers of the problem manufacturing machines. The step e15 includes determining one or more processing factors influencing the problem chambers of the problem manufacturing machines according to the processing factor information of each chamber of each manufacturing machine and the quality information of the products and via the determined test method.

It can be understood that, the preset combination being a combination of the chamber, the manufacturing machine, and the processing workstation, the preset combination can have other variations, similar to the combination of the manufacturing machine and the processing workstation and is not described herein.

The second embodiment obtains basic information on processing history of the products passed by each manufacturing machine at each processing workstation, obtains processing factor information of each manufacturing machine at each processing workstation, where each product is passed by a defect detection workstation after the product is passed by at least one processing workstation, obtains quality information of the products detected by each defect detection workstation, determines one or more problem manufacturing machines at one or more problem processing workstations according to the basic information on processing history of the products passed by each manufacturing machine at each processing workstation and the quality information of the products, and determines one or more processing factors influencing the problem manufacturing machines according to the processing factor information of each manufacturing machine and the quality information of the products. The method improves the efficiency and the accuracy of analysis and determines the processing factors influencing the problem manufacturing machines.

Figure 3:
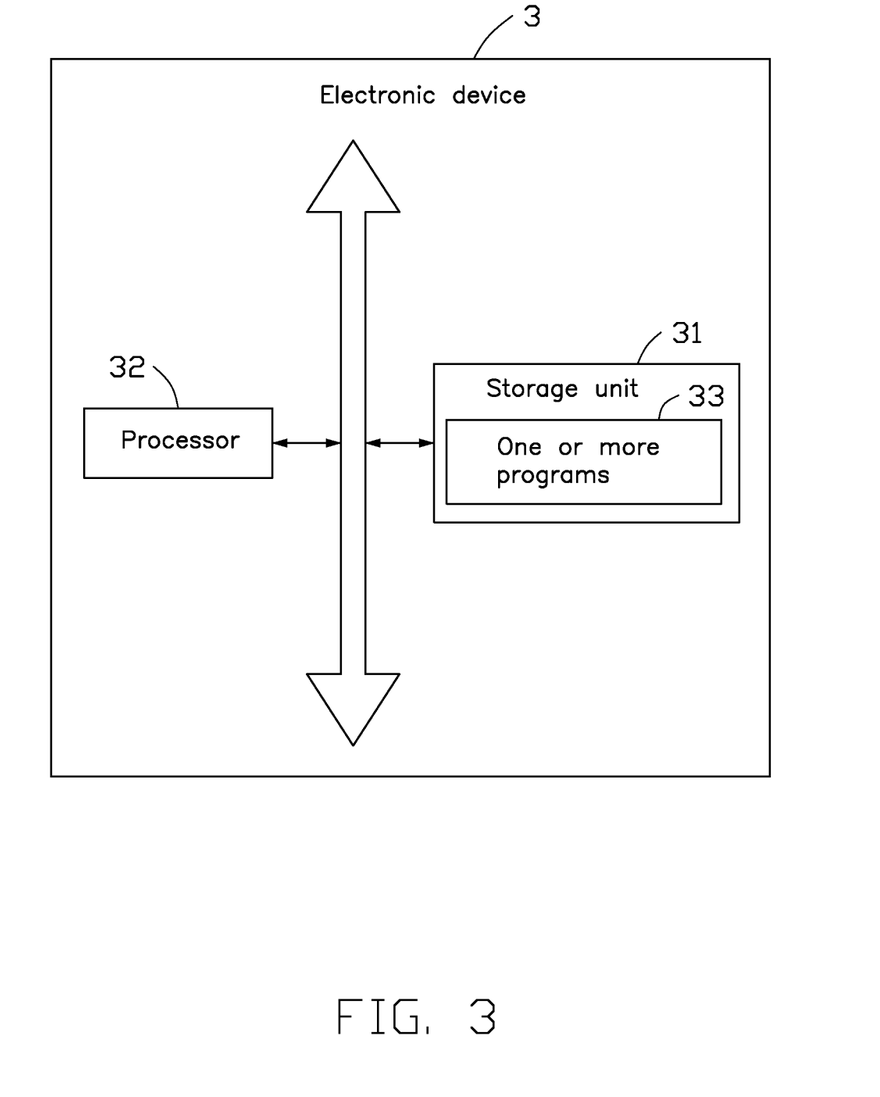
FIG. 3 illustrates a block diagram of a third embodiment of an electronic device for finding suspicious manufacturing machines and processing factors at processing workstations of causing defects.

FIG. 3 illustrates a block diagram of an embodiment of an electronic device. The electronic device 3 can include a storage unit 31, at least one processor 32, and one or more programs 33 stored in the storage unit 31 and can be run on the at least one processor 32. The at least one processor 32 can execute the one or more programs 33 to accomplish the steps of the exemplary method. Or the at least one processor 32 can execute the one or more programs 33 to accomplish the functions of the exemplary device.

The one or more programs 33 can be divided into one or more modules/units. The one or more modules/units can be stored in the storage unit 31 and executed by the at least one processor 32 to accomplish the purpose of the present disclosure. The one or more modules/units can be a series of program command segments which can perform specific functions, and the command segment is configured to describe the execution process of the one or more programs 33 in the electronic device 3. For example, the one or more programs 33 can be divided into modules as shown in FIG. 1, a detail of the function of each module can refer to the first embodiment.

The electronic device 3 can be any suitable electronic device, for example, a personal computer, a tablet computer, a mobile phone, a PDA, or the like. A person skilled in the art knows that the device in FIG. 3 is only an example and is not to be considered as limiting of the electronic device 3, the electronic device 3 may include more or fewer parts than the diagram, or may combine certain parts, or include different parts, such as the electronic device 3 including one or more buses, and so on.

The at least one processor 32 can be one or more central processing units, or it can be one or more other universal processors, digital signal processors, application specific integrated circuits, field-programmable gate arrays, or other programmable logic devices, discrete gate or transistor logic, discrete hardware components, and so on. The at least one processor 32 can be a microprocessor or the at least one processor 32 can be any regular processor or the like. The at least one processor 32 can be a control center of the electronic device 3, using a variety of interfaces and lines to connect various parts of the entire electronic device 3.

The storage unit 31 stores the one or more programs 33 and/or modules/units. The at least one processor 32 can run or execute the one or more programs and/or modules/units stored in the storage unit 31, call out the data stored in the storage unit 31 and accomplish the various functions of the electronic device 3. The storage unit 31 may include a program area and a data area. The program area can store an operating system, and applications that are required for the at least one function, such as sound playback features, image playback functions, and so on. The data area can store data created according to the use of the electronic device 3, such as audio data, and so on. In addition, the storage unit 31 can include a non-transitory storage medium, such as hard disk, memory, plug-in hard disk, smart media card, secure digital, flash card, at least one disk storage device, flash memory, or another non-transitory storage medium.

If the integrated module/unit of the electronic device 3 is implemented in the form of or by means of a software functional unit and is an independent product sold or used, all parts of the integrated module/unit of the electronic device 3 may be stored in a computer-readable storage medium. The electronic device 3 can use one or more programs to control the related hardware to accomplish all parts of the method of this disclosure. The one or more programs can be stored in a computer-readable storage medium. The one or more programs can accomplish the block of the exemplary method when executed by the at least one processor. The one or more stored programs can include program code. The program code can be in the form of source code, object code, executable code file, or in some intermediate form. The computer-readable storage medium may include any entity or device capable of recording and carrying the program codes, recording media, USB flash disk, mobile hard disk, disk, computer-readable storage medium, and read-only memory.

It should be emphasized that the above-described embodiments of the present disclosure, including any particular embodiments, are merely possible examples of implementations, set forth for a clear understanding of the principles of the disclosure. Many variations and modifications can be made to the above-described embodiment(s) of the disclosure without departing substantially from the spirit and principles of the disclosure. All such modifications and variations are intended to be included herein within the scope of this disclosure and protected by the following claims.

What is claimed is:

1. A method for finding suspicious manufacturing machines and processing factors at processing workstations of causing defects, comprising:
   obtaining basic information on processing history of the products passed by each manufacturing machine at each processing workstation;
   obtaining processing factor information of each manufacturing machine at each processing workstation, where each product is passed by a defect detection workstation after the product is passed by at least one processing workstation;
   obtaining quality information of the products detected by each defect detection workstation;
   determining one or more problem manufacturing machines at one or more problem processing workstations according to the basic information on processing history of the products passed by each manufacturing machine at each processing workstation and the quality information of the products;

determining one or more processing factors influencing the problem manufacturing machines according to the processing factor information of each manufacturing machine and the quality information of the products; the processing factors being a preset state of the manufacturing machine when one product is passed by the manufacturing machine;

wherein determining one or more problem manufacturing machines at one or more problem processing workstations according to the basic information on processing history of the products passed by each manufacturing machine at each processing workstation and the quality information of the products comprises:

determining a concentration degree of defect of preset combination according to the basic information on processing history of the products passed by each manufacturing machine at each processing workstation and the quality information of the products, where the preset combination is a combination of the manufacturing machine and the processing workstation;

determining one or more problem manufacturing machines at one or more problem processing workstations according to the concentration degree of defect of preset combination;

wherein determining a concentration degree of defect of preset combination according to the basic information on processing history of the products passed by each manufacturing machine at each processing workstation and the quality information of the products comprises:

determining a ratio a1 of an output of the products passed by each preset combination to a total output of the products passed by all the preset combinations according to the basic information on processing history of the products passed by each manufacturing machine at each processing workstation;

determining a ratio a2 of an output of defect products passed by each preset combination to the output of the products passed by each preset combination according to the basic information on processing history of the products passed by each manufacturing machine at each processing workstation and the quality information of the products;

determining a ratio a4 of the ratio a2 to a ratio a3 which is equal to a ratio of a total output of defect products passed by all the preset combinations to the total output of the products passed by all the preset combinations;

determining the concentration degree of defect of preset combination according to the ratio a1, the ratio a2, and the ratio a4.

2. The method according to claim 1, wherein determining the concentration degree of defect of preset combination according to the ratio a1, the ratio a2, and the ratio a4 comprises:

calculating a plurality of values of preset function with the ratio a1, the ratio a2, and the ratio a4 as the parameters;

determining the concentration degree of defect of preset combination according to the values of the preset function, where the concentration degree of defect of preset combination is higher if the value of the preset function is greater, and the concentration degree of defect of preset combination is lower if the value of the preset function is less, or the concentration degree of defect of preset combination is higher if the value of the preset function is less, and the concentration degree of defect of preset combination is lower if the value of the preset function is greater.

3. The method according to claim 1, wherein determining one or more processing factors of influencing the problem manufacturing machines according to the processing factor information of each manufacturing machine and the quality information of the products comprises:

determining a type of each processing factor of each manufacturing machine to be one of a continuous type and a categorical type according to the processing factor information of each manufacturing machine;

determining each test method from a Student's t test, a Mann-Whitney-Wilcoxon test, a Chi-square test, and a Fisher's exact test according to the type of each processing factor of each manufacturing machine and a number of quality information of the products passed by the problem manufacturing machines;

determining one or more processing factors influencing the problem manufacturing machines according to the processing factor information of each manufacturing machine and the quality information of the products via the determined test method.

4. The method according to claim 3, wherein determining a type of each processing factor of each manufacturing machine to be one of a continuous type and a categorical type according to the processing factor information of each manufacturing machine comprises:

determining whether the number of different kinds of value of the processing factor of the manufacturing machine in the processing factor information of each manufacturing machine is greater than five;

determining that the type of the processing factor of the manufacturing machine is the continuous type if the number of different kinds of value of the processing factor of the manufacturing machine in the processing factor information of each manufacturing machine is greater than five;

determining that the type of the processing factor of the manufacturing machine is the categorical type if the number of different kinds of value of the processing factor of the manufacturing machine in the processing factor information of each manufacturing machine is not more than five.

5. The method according to claim 3, wherein determining each test method from a Student's t test, a Mann-Whitney-Wilcoxon test, a Chi-square test, and a Fisher's exact test according to the type of each processing factor of each manufacturing machine and a number of quality information of the products passed by the problem manufacturing machines comprises:

determining that the test method is the Student's t test if the type of the processing factor of the manufacturing machine is the continuous type and a number of the products passed by the problem manufacturing machine is greater than or equal to thirty;

determining that the test method is the Mann-Whitney-Wilcoxon test if the type of the processing factor of the manufacturing machine is the continuous type and a number of the products passed by the problem manufacturing machine is less than thirty;

determining that the test method is the Chi-square test if the type of the processing factor of the manufacturing machine is the categorical type and a number of the information representing that the product has no defect and a number of the information representing that the product has defect in the quality information of the product passed by the problem manufacturing machine in each category is greater than or equal to five, or if the type of the processing factor of the manufacturing machine is the categorical type and a number of the categories is greater than two;

determining that the test method is the Fisher's exact test if the type of the processing factor of the manufacturing machine is the categorical type, the number of the categories is two, and a number of the information representing that the product has no defect or a number of the information representing that the product has defect in the quality information of the product passed by the problem manufacturing machine in one of the two categories is less than five.

6. An electronic device comprising:

a storage device;

at least one processor; and the storage device storing one or more programs, which when executed by the at least one processor, cause the at least one processor to:

obtain basic information on processing history of the products passed by each manufacturing machine at each processing workstation;

obtain processing factor information of each manufacturing machine at each processing workstation, where each product is passed by a defect detection workstation after the product is passed by at least one processing workstation;

obtain quality information of the products detected by each defect detection workstation;

determine one or more problem manufacturing machines at one or more problem processing workstations according to the basic information on processing history of the products passed by each manufacturing machine at each processing workstation and the quality information of the products;

determine one or more processing factors influencing the problem manufacturing machines according to the processing factor information of each manufacturing machine and the quality information of the products; the processing factors being a preset state of the manufacturing machine when one product is passed by the manufacturing machine;

determine a concentration degree of defect of preset combination according to the basic information on processing history of the products passed by each manufacturing machine at each processing workstation and the quality information of the products, where the preset combination is a combination of the manufacturing machine and the processing workstation;

determine one or more problem manufacturing machines at one or more problem processing workstations according to the concentration degree of defect of preset combination;

determine a ratio a1 of an output of the products passed by each preset combination to a total output of the products passed by all the preset combinations according to the basic information on processing history of the products passed by each manufacturing machine at each processing workstation;

determine a ratio a2 of an output of defect products passed by each preset combination to the output of the products passed by each preset combination according to the basic information on processing history of the products passed by each manufacturing machine at each processing workstation and the quality information of the products;

determine a ratio a4 of the ratio a2 to a ratio a3 which is equal to a ratio of a total output of defect products passed by all the preset combinations to the total output of the products passed by all the preset combinations;

determine the concentration degree of defect of preset combination according to the ratio a1, the ratio a2 and the ratio a4.

7. The electronic device according to claim 6, further causing the at least one processor to:

calculate a plurality of values of preset function with the ratio a1, the ratio a2, and the ratio a4 as the parameters;

determine the concentration degree of defect of preset combination according to the values of the preset function, where the concentration degree of defect of preset combination is higher if the value of the preset function is greater, and the concentration degree of defect of preset combination is lower if the value of the preset function is less, or the concentration degree of defect of preset combination is higher if the value of the preset function is less, and the concentration degree of defect of preset combination is lower if the value of the preset function is greater.

8. The electronic device according to claim 6, further causing the at least one processor to:

determine a type of each processing factor of each manufacturing machine to be one of a continuous type and a categorical type according to the processing factor information of each manufacturing machine;

determine each test method from a Student's t test, a Mann-Whitney-Wilcoxon test, a Chi-square test, and a Fisher's exact test according to the type of each processing factor of each manufacturing machine and a number of quality information of the products passed by the problem manufacturing machines;

determine one or more processing factors influencing the problem manufacturing machines according to the processing factor information of each manufacturing machine and the quality information of the products via the determined test method.

9. The electronic device according to claim 8, further causing the at least one processor to:

determine whether the number of different kinds of value of the processing factor of the manufacturing machine in the processing factor information of each manufacturing machine is greater than five;

determine that the type of the processing factor of the manufacturing machine is the continuous type if the number of different kinds of value of the processing factors of the manufacturing machine in the processing factor information of each manufacturing machine is greater than five;

determine that the type of the processing factor of the manufacturing machine is the categorical type if the number of different kinds of value of the processing factor of the manufacturing machine in the processing factor information of each manufacturing machine is not more than five.

10. The electronic device according to claim 8, further causing the at least one processor to:

determine that the test method is the Student's t test if the type of the processing factor of the manufacturing machine is the continuous type and a number of the products passed by the problem manufacturing machine is greater than or equal to thirty;

determine that the test method is the Mann-Whitney-Wilcoxon test if the type of the processing factor of the manufacturing machine is the continuous type and a number of the products passed by the problem manufacturing machine is less than thirty;

determine that the test method is the Chi-square test if the type of the processing factor of the manufacturing machine is the categorical type and a number of the information representing that the product has no defect and a number of the information representing that the product has defect in the quality information of the product passed by the problem manufacturing machine in each category is greater than or equal to five, or if the type of the processing factor of the manufacturing machine is the categorical type and a number of the categories is greater than two;

determine that the test method is the Fisher's exact test if the type of the processing factor of the manufacturing machine is the categorical type, the number of the categories is two, and a number of the information representing that the product has no defect or a number of the information representing that the product has defect in the quality information of the product passed by the problem manufacturing machine in one of the two categories is less than five.

11. A non-transitory storage medium storing a set of commands, when the commands being executed by at least one processor of an electronic device, causing the at least one processor to:
- obtain basic information on processing history of the products passed by each manufacturing machine at each processing workstation;
- obtain processing factor information of each manufacturing machine at each processing workstation, where each product is passed by a defect detection workstation after the product is passed by at least one processing workstation;
- obtain quality information of the products detected by each defect detection workstation;
- determine one or more problem manufacturing machines at one or more problem processing workstations according to the basic information on processing history of the products passed by each manufacturing machine at each processing workstation and the quality information of the products;
- determine one or more processing factors influencing the problem manufacturing machines according to the processing factor information of each manufacturing machine and the quality information of the products; the processing factors being a preset state of the manufacturing machine when one product is passed by the manufacturing machine;
- determine a concentration degree of defect of preset combination according to the basic information on processing history of the products passed by each manufacturing machine at each processing workstation and the quality information of the products, where the preset combination is a combination of the manufacturing machine and the processing workstation;
- determine one or more problem manufacturing machines at one or more problem processing workstations according to the concentration degree of defect of preset combination;
- determine a ratio $a1$ of an output of the products passed by each preset combination to a total output of the products passed by all the preset combinations according to the basic information on processing history of the products passed by each manufacturing machine at each processing workstation;
- determine a ratio $a2$ of an output of defect products passed by each preset combination to the output of the products passed by each preset combination according to the basic information on processing history of the products passed by each manufacturing machine at each processing workstation and the quality information of the products;
- determine a ratio $a4$ of the ratio $a2$ to a ratio $a3$ which is equal to a ratio of a total output of defect products passed by all the preset combinations to the total output of the products passed by all the preset combinations;
- determine the concentration degree of defect of preset combination according to the ratio $a1$, the ratio $a2$, and the ratio $a4$.

12. The non-transitory storage medium according to claim 11, further causing the at least one processor to:
- calculate a plurality of values of preset function with the ratio $a1$, the ratio $a2$, and the ratio $a4$ as the parameters;
- determine the concentration degree of defect of preset combination according to the values of the preset function, where the concentration degree of defect of preset combination is higher if the value of the preset function is greater, and the concentration degree of defect of preset combination is lower if the value of the preset function is less, or the concentration degree of defect of preset combination is higher if the value of the preset function is less, and the concentration degree of defect of preset combination is lower if the value of the preset function is greater.

13. The non-transitory storage medium according to claim 11, further causing the at least one processor to:
- determine a type of each processing factor of each manufacturing machine to be one of a continuous type and a categorical type according to the processing factor information of each manufacturing machine;
- determine each test method from a Student's t test, a Mann-Whitney-Wilcoxon test, a Chi-square test, and a Fisher's exact test according to the type of each processing factor of each manufacturing machine and a number of quality information of the products passed by the problem manufacturing machines;
- determine one or more processing factors influencing the problem manufacturing machines according to the processing factor information of each manufacturing machine and the quality information of the products via the determined test method.

14. The non-transitory storage medium according to claim 13, further causing the at least one processor to:
- determine that the test method is the Student's t test if the type of the processing factor of the manufacturing machine is the continuous type and a number of the products passed by the problem manufacturing machine is greater than or equal to thirty;
- determine that the test method is the Mann-Whitney-Wilcoxon test if the type of the processing factor of the manufacturing machine is the continuous type and a number of the products passed by the problem manufacturing machine is less than thirty;
- determine that the test method is the Chi-square test if the type of the processing factor of the manufacturing machine is the categorical type and a number of the information representing that the product has no defect and a number of the information representing that the product has defect in the quality information of the product passed by the problem manufacturing machine in each category is greater than or equal to five, or if the type of the processing factor of the manufacturing machine is the categorical type and a number of the categories is greater than two;

determine that the test method is the Fisher's exact test if the type of the processing factor of the manufacturing machine is the categorical type, the number of the categories is two, and a number of the information representing that the product has no defect or a number of the information representing that the product has defect in the quality information of the product passed by the problem manufacturing machine in one of the two categories is less than five.

* * * * *